United States Patent [19]
Quinn et al.

[11] Patent Number: 5,545,913
[45] Date of Patent: Aug. 13, 1996

[54] ASSEMBLY FOR MOUNTING SEMICONDUCTOR CHIPS IN A FULL-WIDTH-ARRAY IMAGE SCANNER

[75] Inventors: Kraig A. Quinn, Webster; Josef E. Jedlicka, Rochester; Brian T. Ormond, Webster, all of N.Y.

[73] Assignee: Xerox Corporation, Stamford, Conn.

[21] Appl. No.: 330,299

[22] Filed: Oct. 17, 1994

[51] Int. Cl.⁶ .................................................. H01L 31/00
[52] U.S. Cl. ........................... 257/443; 257/448; 257/459; 257/434
[58] Field of Search ..................... 257/222, 233, 257/433, 443, 448, 457, 459, 779, 778, 784, 234, 434, 680; 156/273.9, 273.5, 275.5, 275.7, 295, 297; 361/805, 807, 820

[56] References Cited

U.S. PATENT DOCUMENTS

| | | | |
|---|---|---|---|
| 4,954,197 | 9/1990 | Jedlicka et al. | 156/275.7 |
| 4,976,802 | 12/1990 | LeBlanc | 756/273.5 |
| 5,034,083 | 7/1991 | Camparelli et al. | 156/273.5 |
| 5,311,059 | 5/1994 | Banerji et al. | 257/778 |
| 5,326,414 | 7/1994 | Mosher et al. | 156/242 |

FOREIGN PATENT DOCUMENTS

| | | | |
|---|---|---|---|
| 5-335542 | 12/1993 | Japan | 257/443 |

Primary Examiner—Rolf Hille
Assistant Examiner—Minhloan Tran
Attorney, Agent, or Firm—R. Hutter

[57] ABSTRACT

An assembly facilitates mounting a set of abutted semiconductor chips, such as chips aligned to form a single full-page-width linear array of photosensors in a digital scanner or copier. An elongated bead of electrically conductive adhesive extends along a surface of a support substrate. A plurality of semiconductor chips is disposed along the elongated bead, each semiconductor chip including a linear array of photosensors on a front surface thereof, and a back surface attached to the support substrate by the electrically conductive adhesive. A connection block is disposed along another portion of the elongated bead, the block including a first surface contacting the bead, a second surface, and a conductor extending from the first surface to the second surface.

13 Claims, 2 Drawing Sheets

ASSEMBLY FOR MOUNTING SEMICONDUCTOR CHIPS IN A FULL-WIDTH-ARRAY IMAGE SCANNER

FIELD OF THE INVENTION

BACKGROUND OF THE INVENTION

The present invention relates to an assembly of semiconductor chips having photosensors thereon for use in a full-page-width image scanner, such as would be used in, for example, a digital copier.

In a full-page-width image scanner, there is provided a linear array of small photosensors which extends the full width of an original document, such as 11 inches. These photosensors may be spaced as finely as 600 to the inch on each chip. When the original document moves past the linear array, each of the photosensors converts reflected light from the original image into electrical signals. The motion of the original image perpendicular to the linear array causes a sequence of signals to be output from each photosensor, which can be converted into digital data.

A currently-preferred design for creating such a long linear array of photosensors is to provide a set of relatively small semiconductor chips, each semiconductor chip defining thereon a linear array of photosensors along with ancillary circuit devices. These chips are typically approximately ¾ inches in length; in order to create a practical full-page-width array, as many as twenty or more of these chips can be abutted end-to-end to form a single linear array of photosensors. The abutted chips are typically mounted on a support platform. This support platform also includes circuitry, such as on a printed wire board, which accesses the circuit devices on the individual chips for a practical system. The interconnections between the relatively large-scale conductors on the printed wire board and the relatively small contact pads on the semiconductor chips are preferably created by wire bonds which are ultrasonically welded to both the printed wire board conductors and to contact pads on the chips.

One common design for semiconductor chips is to use the "back plane" of each chip, i.e., the surface of the chip opposite that having the photosensors and the circuitry thereon, as a ground terminal for the circuitry on the chip. It is therefore desirable to electrically access each chip in the set of chips forming the linear array both on the top surface thereof, where the contact pads are typically located, and also on the back plane thereof.

U.S. Pat. No. 4,649,424 discloses a CCD imaging apparatus having an improved signal-to-noise ratio, wherein the CCD chip is grounded on its back plane by two separate ground-plane surfaces.

U.S. Pat. No. 4,954,197 discloses a process for fabricating a full-width array of smaller chips bonded end-to-end onto a substrate by an electrically connective heat activated adhesive.

U.S. Pat. No. 4,976,802 discloses a process for fabricating a full-width scanning or printing array with plural chips bonded end-to-end on a glass substrate using a photocurable adhesive. Once the chips are placed on the substrate, light is transmitted through the substrate in order to cure the adhesive.

U.S. Pat. No. 5,034,083 discloses an extended scanning or printing array having smaller chips bonded end-to-end onto a glass substrate having an opaque coating thereon which is thermally and/or electrically conductive. The coating is removed at discrete sites to allow a photocurable adhesive to be cured through exposure to ultraviolet light transmitted through the substrate.

U.S. Pat. No. 5,311,059 discloses a semiconductor device package comprising a substrate with a metallization pattern on one surface and a semiconductor device having an active surface and a grounded surface on opposed sides. The semiconductor device is attached to the metalization pattern with the active surface thereof facing the substrate. An electrically conductive material covers the exposed grounded surface of the semiconductor device to provide an electrical connection between the grounded surface of the semiconductor and the metalization pattern on the substrate.

U.S. Pat. No. 5,326,414 discloses a circuit carrier assembly including a support structure having a base and surrounding walls forming an internal cavity. A plurality of conductor paths are disposed within the cavity, forming a polymeric cover with wall members integrally fashioned into a surface thereof.

SUMMARY OF THE INVENTION

According to one aspect of the present invention, there is provided a semiconductor chip assembly comprising a support substrate and an elongated bead of electrically conductive adhesive extending along a surface of the support substrate. A semiconductor chip is disposed along a first portion of the elongated bead, and attached to the support substrate by the electrically conductive adhesive. A connection block is disposed along a second portion of the elongated bead, the connection block including a first surface contacting the elongated bead and a second surface, with a conductor extending from the first surface to the second surface.

According to another aspect of the present invention, there is provided an assembly for a linear array of photosensors, comprising a support substrate and an elongated bead of electrically conductive adhesive, extending along a surface of the support substrate. A plurality of semiconductor chips are disposed along a first portion of the elongated bead. Each chip includes on the front surface thereof a linear array of photosensors, the linear arrays of the semiconductor chips being aligned to form a single linear array of photosensors. The back surface of each chip is attached to the support substrate by the electrically conductive adhesive. A connection block is disposed along a second portion of the elongated bead, the connection block including a first surface contacting the elongated bead and a second surface, with a conductor extending from the first surface to the second surface.

DETAILED DESCRIPTION OF THE INVENTION

Figure 1:
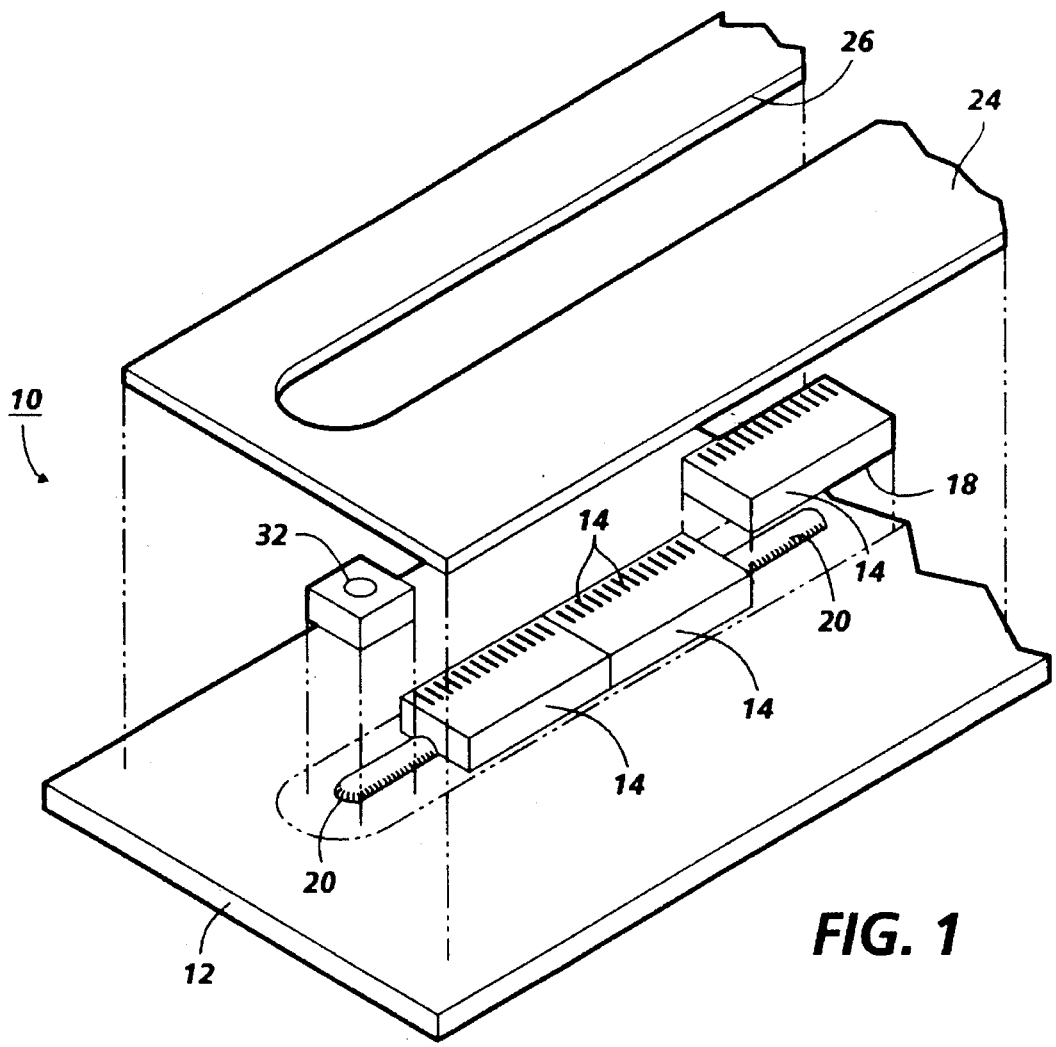
FIG. 1 is a partially-exploded perspective view of a portion of a chip array assembly according to the present invention.

FIG. 1 is a partially-exploded perspective view showing the main elements of a semiconductor assembly according to the present invention. The assembly, generally indicated as 10, includes a support substrate 12, which is typically made of an electrically insulative material, such as borosilicate glass. Disposed on the support substrate 10 is a plurality of semiconductor chips 14 which are abutted end-to-end along the support substrate 12. In the preferred embodiment of the present invention, each of these semiconductor chips 14 includes a linear array of photosensors 16, which are used to output electrical signals in response to light from an image focused thereon. When a plurality of chips 14 are abutted end-to-end, the linear arrays 16 of photosensors on each chip together combine to form a single linear array of photosensors which extends the width of a page of hard-copy data being scanned by the photosensors.

In any semiconductor chip design, the back plane of the chip, which in the present case is the surface of the chip opposite that having the photosensitive devices thereon, may be used as a "ground plane" for circuitry which is located on board the chip. Although in a typical design of a photosensitive semiconductor chip, all of the active devices are disposed on the side of the chip having the photosensors thereon, the back plane, indicated as 18, is nonetheless electrically significant for proper operation of the chip, and therefore the back plane 18 of each chip 14 is desired to be electrically connected to a larger system.

The semiconductor chips 14 are attached by their back planes 18 on support substrate 12 by an elongated bead 20 of electrically conductive adhesive, extending along a surface of the support substrate 12. Adhesives which are electrically conductive typically include silver flakes suspended in an epoxy resin. One advantage of this type of adhesive is that it is highly thermally conductive as well, which has been found to aid in the practical design of such assemblies. Thus, the elongated bead 20 serves to hold the semiconductor chips 14 in place so that the photosensors 16 thereon form a precisely-aligned single linear array, and also, because the bead 20 is conductive, allows the back planes of each chip to be electrically connected.

Also disposed on the top surface of support substrate 12 is a printed wire board 24, having an opening 26 defined therein. Printed wire board 24 may be of any design known in the art, and typically comprises an epoxy resin substrate having a conductive material thereon, preferably in the form of copper or aluminum printed circuit connections (not shown) sputtered in a desired configuration thereon.

Figure 2:
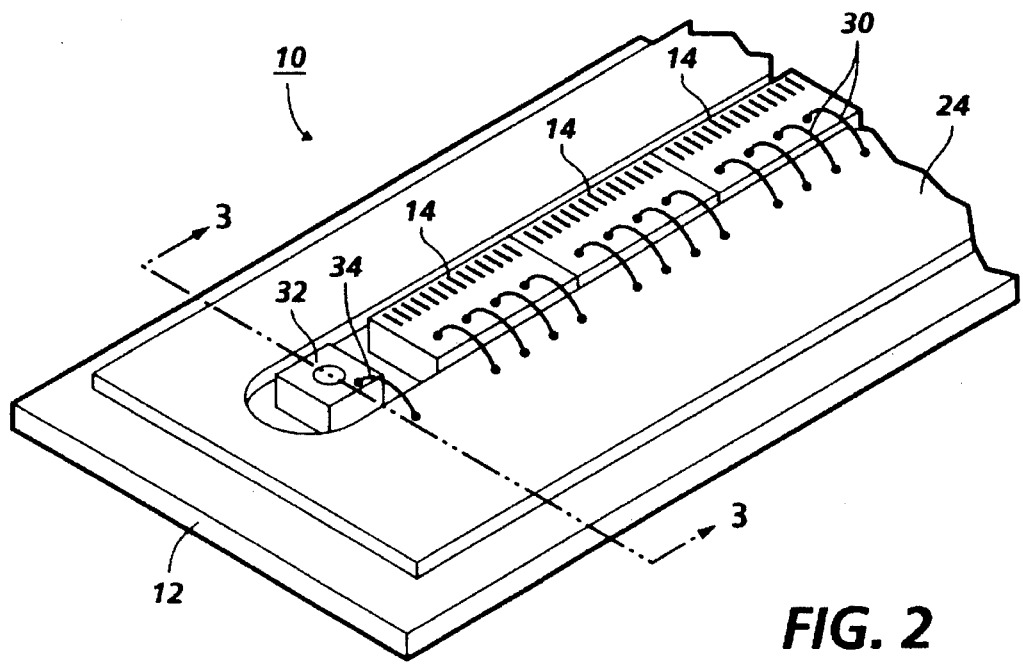
FIG. 2 is a perspective view of a portion of the assembled array according to the present invention.

FIG. 2 is a perspective view of the assembly 10 of the present invention, substantially in a state of final assembly. It can be seen in the Figure that the chips 14 are attached to the support substrate 12. Printed wire board 24 acts as a physical interface between the circuitry on the top surfaces of the chips 14 and the connections to elsewhere in the scanning apparatus. In the illustrated embodiment, the chips 14 are disposed within opening 26 in printed wire board 24. In order to make the necessary electrical connections between the conductors on the exposed side of printed wire board 24 and contact pads (not shown) on semiconductor chips 14, there are provided the necessary number of wire bonds 30 which arch over from conductors on the top of printed wire board 24 to the necessary contact pads on the chips 14. Such ultrasonic wire bonds are typically created by ultrasonic and/or thermal welding of a small length of aluminum wire to the conductor or contact pad.

In most preferred designs of semiconductor chips, the grounding of the electrical devices on the chips is preferably accomplished through the back plane 18 of each chip. It is desirable, from a standpoint of design simplicity, if this grounding could be made through a conductor which is present on the exposed surface of printed wire board 24. Generally, a direct connection of a wire bond such as 34 with the elongated bead 20 is problematic, because the epoxy used in elongated bead 20 does not readily accept an ultrasonic wire bond. It is therefore desirable to provide some sort of connection between the elongated bead 20 (in effect, under the chips 14) and the exposed surface of printed wire board 24, which is both reliable and conducive to the mass production of the assemblies 10.

Also shown in FIGS. 1 and 2 is a "connection block" indicated as 32. Connection block 32 is preferably disposed at one end of the elongated bead 20, preferably out of the way of the single linear array formed by the set of arrays of photosensor 16 on the chips 14. Connection block 32 provides a structure which is practical for an electrical connection between elongated bead 20 and a wire bond such as 34, which can connect to a conductor on the top surface of printed wire board 24.

Figure 3:
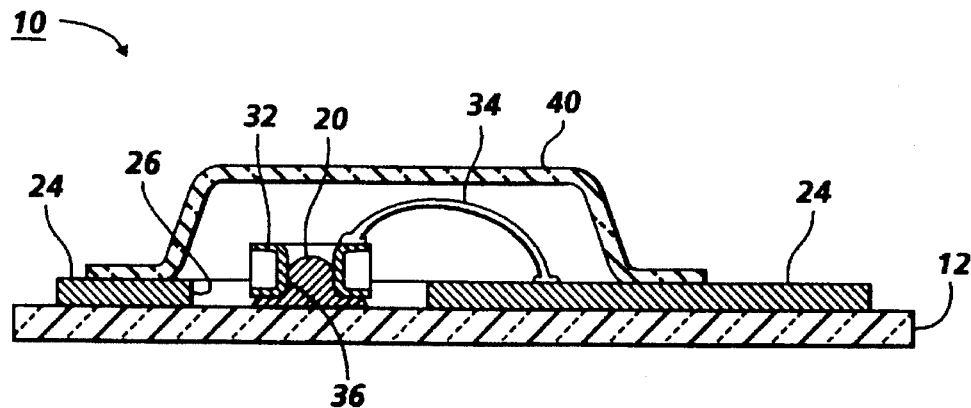
FIG. 3 is a sectional elevational view through line 3—3 in FIG. 2 of the assembled array according to the present invention.

FIG. 3 is a sectional elevational view through line 3—3 in FIG. 2, showing the configuration of connection block 32 and wire bond 34 with the rest of the assembly 10. Connection block 32 is preferably of a thickness between the surface contacting bead 20 and the opposite surface thereof, approximately equal to that of chips 14 along the array. As can be seen in FIG. 3, connection block 32 preferably defines therein a through-hole, indicated as 36. The purpose of through-hole 36 is to ensure a secure connection to elongated bead 20. If the connection block 32 is pressed into a portion of elongated bead 20, particularly when elongated bead 20 is in an uncured or tacky state, some of the epoxy will form a convex meniscus in the through-hole 36. Connection block 32 also provides a surface for a secure connection, through an ultrasonic and/or thermal weld, to a wire bond 34, which attaches to a conductor (not shown) on the top surface of printed wire board 24.

FIG. 3 also shows a cover glass 40, which is part of a preferred embodiment of the assembly 10. This cover glass 40 is basically a glass "bubble" having a shape corresponding to that of the opening 26 in printed wire board 24. In the preferred embodiment of the present invention, cover glass 40 extends over the semiconductor chips 14 and the wire bonds 30 connected thereto, to protect both the chips and the wire bonds. Preferably, the cover glass 40 contacts only the surfaces of printed wire board 24, and does not touch any surface of chips 14 or wire bonds 30.

Figure 4:
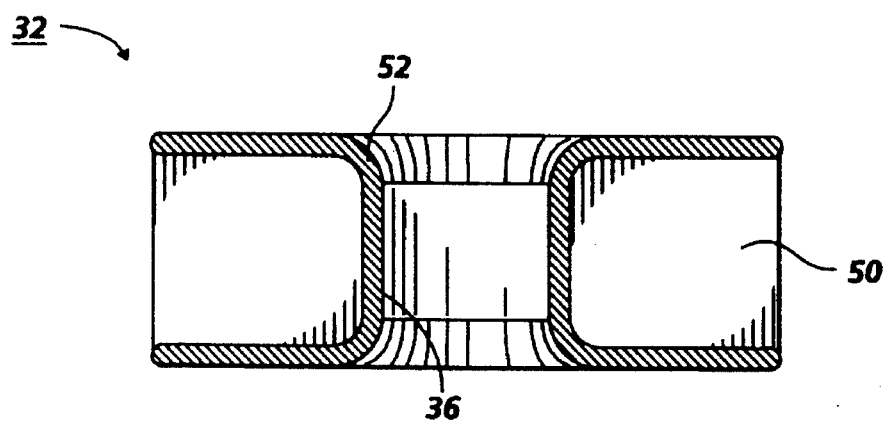
FIG. 4 is a sectional elevational view of one embodiment of a connection block as used in the present invention, shown in isolation.

FIG. 4 is an elevational sectional view of one embodiment of connection block 32, shown in isolation. In this embodiment, connection block 32 is made of a printed wiring board (PWB) material which may be identical to that of the printed wire board 24. The base member 50 is made of an electrically insulated fiberglass or epoxy resin, and the conductive plating 52 is formed from copper deposits on both sides of the base member 50. Portions of the copper are chemically etched away to form desired circuit traces on either surface of the block 50. To make the connection between the top and bottom conductors through through-hole 36, a hole is drilled in the base member 50, and the interior surface of the through-hole is plated with copper. In order to allow proper wire bonding, the copper traces are first be plated with nickel and finally with gold. For convenient mass production of such connection blocks 32 as shown in FIG. 4, a relatively large number of such blocks could be formed from a single printed wiring board with many through-holes formed therein. After the copper traces are placed on the board, the board can be diced into many small connection blocks 32.

Figure 5:
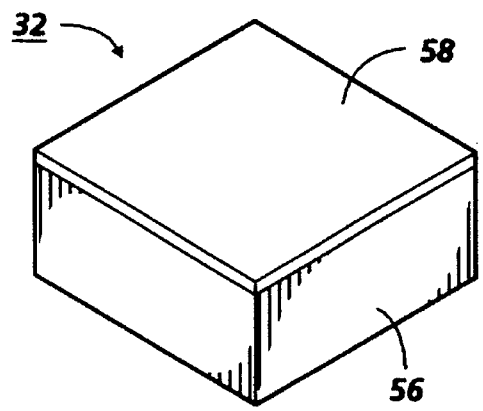
FIG. 5 is a perspective view of another embodiment of a connection block as used in the present invention, shown in isolation.

An alternative construction for connection block 32, which may be preferable from a cost standpoint, involves making the connection block 32 out of a single simple block of copper which is placed on bead 20. Such a block may or may not include a through-hole, as desired. However, if a solid block of copper is used for connection block 32, the top surface thereof, which accepts the wire bond 34, is plated with a final layer of pure aluminum. FIG. 5 is a perspective view of this alternate embodiment of the connection block 32, shown in isolation. The connection block 32 includes a solid block of copper 56, and a conductive plating 58 on a top surface. Conductive plating 58 is preferably made of pure aluminum. In this embodiment, the bottom surface of the block 32, as shown in FIG. 5, contacts the elongated bead 20, while the aluminum plating 58 is available for a wire bond connection. The block 56 itself serves as a conductor between the plating 58 and the elongated bead 20.

The advantage of connection block 32 is that its design ensures a secure and reliable connection between the elongated bead 20 and wire bond 34, which in turn facilitates a secure connection to the printed circuit on printed wire board 24. Through use of the connection block 32, elongated beads 20 can be formed as simple straight lines on a set of support substrates 12 in a mass-production process, without having to adapt the bead 20 to connect to a particular ground source. The connection block 32, because it is roughly the same thickness as the chips 14, also allows the wire bond 34 to be made in the same wire bonding step in which all of the other wire bonds 30 are made. This connection between the back plane 18 of a chip 14 through elongated bead 20 to a conductor on the top surface of printed wire board 24 thus substantially simplifies the design and mass production of a photosensor assembly.

While this invention has been described in conjunction with various embodiments, it is evident that many alternatives, modifications, and variations will be apparent to those skilled in the art. Accordingly, it is intended to embrace all such alternatives, modifications, and variations as fall within the spirit and broad scope of the appended claims.

We claim:

1. A semiconductor chip assembly, comprising:

a support substrate;

an elongated bead of electrically conductive adhesive, extending along a surface of the support substrate;

a semiconductor chip disposed along a first portion of the elongated bead, and attached to the support substrate by the elongated bead of electrically conductive adhesive; and a connection block disposed along a second portion of the elongated bead, the connection block including a first surface contacting the elongated bead and a second surface, and a conductor extending from the first surface to the second surface.

2. The assembly of claim 1, the connection block being of a thickness between the first surface and the second surface thereof approximately equal to a thickness of the semiconductor chip.

3. The assembly of claim 1, the connection block further including a through-hole defined therein from the first surface to the second surface, the conductor extending through the through hole.

4. The assembly of claim 1, the connection block including a main member comprising copper, and the second surface thereof including an aluminum plating on the main member.

5. The assembly of claim 1, further comprising a wire board attached to the support substrate, the wire board including a conductive material thereon;

a first wire bond extending between the conductive material on the wire board and the semiconductor chip; and a second wire bond extending between the conductive material on the wire board and the second surface of the connection block.

6. The assembly of claim 1, further comprising a cover glass attached to the wire board and extending over the semiconductor chip.

7. The assembly of claim 6, the cover glass extending over the first wire bond and the second wire bond.

8. An assembly for a linear array of photosensors, comprising:

a support substrate;

an elongated bead of electrically conductive adhesive, extending along a surface of the support substrate;

a plurality of semiconductor chips disposed along a first portion of the elongated bead, each semiconductor chip including a front surface and a back surface, each chip including on the front surface thereof a linear array of photosensors a plurality of semiconductor chips being aligned to form a single linear array of photosensors, the back surface of each chip being attached to the support substrate by the elongated bead of electrically conductive adhesive; and a connection block disposed along a second portion of the elongated bead, the connection block including a first surface contacting the elongated bead, a second surface, and a conductor extending from the first surface to the second surface.

9. The assembly of claim 8, the connection block being of a thickness between the first surface and the second surface thereof approximately equal to a thickness of the semiconductor chips.

10. The assembly of claim 8, the connection block further including a through-hole defined therein from the first surface to the second surface, the conductor extending through the through hole.

11. The assembly of claim 8, the connection block including a main member comprising copper, and the second surface thereof including an aluminum plating on the main member.

12. The assembly of claim 8, further comprising a wire board attached to the support substrate, the wire board including a conductive material thereon;

a first wire bond extending between the conductive material on the wire board and a semiconductor chip; and a second wire bond extending between the conductive material on the wire board and the second surface of the connection block further comprising a cover glass attached to the wire board and extending over the semiconductor chips.

13. The assembly of claim 12, the cover glass extending over the first wire bond and the second wire bond.

* * * * *